United States Patent [19]

Armbruster et al.

[11] Patent Number: 4,952,829
[45] Date of Patent: Aug. 28, 1990

[54] RECTIFIER ARRANGEMENT

[75] Inventors: Franz Armbruster, Stuttgart; Hartmut Buck, Marbach; Henning Fasterding, Markgröningen; Wenzel Pubrl, Eberdingen; Stefan Renner, Weissach-Flacht; Karl-Heinz Koplin, Schwieberdingen, all of Fed. Rep. of Germany

[73] Assignee: Robert Bosch GmbH, Stuttgart, Fed. Rep. of Germany

[21] Appl. No.: 347,944

[22] PCT Filed: Jul. 16, 1988

[86] PCT No.: PCT/DE88/00442

§ 371 Date: Apr. 4, 1989

§ 102(e) Date: Apr. 4, 1989

[87] PCT Pub. No.: WO89/02161

PCT Pub. Date: Mar. 9, 1989

[30] Foreign Application Priority Data

Aug. 22, 1987 [DE] Fed. Rep. of Germany ....... 3728081

[51] Int. Cl.$^5$ .................... H02K 11/00; H02M 1/00
[52] U.S. Cl. ............................. 310/68 D; 310/68 R; 363/141; 363/145
[58] Field of Search ............ 310/68 R, 68 D, DIG. 6; 361/386, 387, 388; 363/141, 145

[56] References Cited

U.S. PATENT DOCUMENTS

| | | | |
|---|---|---|---|
| 3,602,793 | 8/1971 | Grozinger | 310/68 D |
| 3,604,963 | 9/1971 | Tawara | 310/68 D |
| 3,629,631 | 12/1971 | Cotton | 310/68 D |
| 3,641,374 | 2/1972 | Sato | 310/68 D |
| 3,777,193 | 12/1973 | Buehner | 310/68 D |
| 3,789,275 | 1/1974 | Sawano et al. | 320/8 |
| 3,831,062 | 8/1974 | Haug et al. | 363/141 |
| 3,927,338 | 12/1975 | Vieilleribiere | 310/68 D |
| 4,065,686 | 12/1977 | Moore | 310/68 D |
| 4,169,282 | 9/1979 | Allport et al. | 310/68 D |
| 4,232,238 | 11/1980 | Saito et al. | 310/68 D |
| 4,419,597 | 12/1983 | Shiga et al. | 310/68 D |
| 4,604,538 | 8/1986 | Merrill et al. | 310/68 D |
| 4,606,000 | 8/1986 | Steele et al. | 310/68 D |

FOREIGN PATENT DOCUMENTS

| | | |
|---|---|---|
| 1256303 | 12/1967 | Fed. Rep. of Germany . |
| 2026911 | 1/1971 | Fed. Rep. of Germany . |
| 2105364 | 9/1971 | Fed. Rep. of Germany . |
| 2735124 | 2/1978 | Fed. Rep. of Germany . |
| 2031028 | 11/1970 | France . |
| 1133639 | 1/1985 | U.S.S.R. .......................... 310/68 D |

Primary Examiner—Peter S. Wong
Assistant Examiner—C. E. LaBalle
Attorney, Agent, or Firm—Michael J. Striker

[57] ABSTRACT

In a rectifier supporting device for (three-phase) generators which is intended particularly for motor vehicles, buses and the like, cooling plates carrying the rectifier diodes are constructed as heat sinks following the circular shape of an end shield of the generator and segment-like cut out portion for a brush holder of the generator. Each of the heat sinks is supported at an axial distance from, but coaxial with, a circuit board arranged between the two heat sinks. The circuit board has a shape corresponding to that of the heat sinks and provides electric connections to the diode head wires and stator wires.

In an advantageous construction of the circuit board, sheathe-like guides extend downward until adjacent to the stator phase windings and receive the stator wires guided up toward the circuit board in an insulated passage through the facing three-phase generator housing parts and heat sink areas.

19 Claims, 3 Drawing Sheets

RECTIFIER ARRANGEMENT

PRIOR ART

The invention is based on a rectifier supporting device for (three-phase) generators, particularly for use in motor vehicles, buses, trains and the like. Such rectifier supporting devices or—in a narrower sense—the arrangement of heat sinks for rectifier diodes are known in electric generators in multiple forms, wherein the respective positive diodes and the respective negative diodes are usually arranged on separate carrier plates, especially in three-phase generators for use in motor vehicles—this is also a preferred area of use of the present invention, and will thus will be discussed in more detail. The fastening of the diodes in the respective carrier plates, which are, at the same time, heat sinks for these diodes, is usually effected by means of insertion in receiving bore holes of the carrier plates or heat sinks, wherein a secure fastening can be achieved by means of soldering or by means of insertion under pressure. The head wires of the diodes are exposed to the outside and are connected with conductors which usually extend in a circuit board until the respective connection points.

Every diode heat sink is usually constructed in the shape of a circle segment or crescent and is fastened in the same plane as the other diode heat sinks on the edge of the circuit board of carrier plate in which the electric interconnections are located. These interconnections can be wires which are inserted in the plastics material of the circuit carrier plate or also punched sheet metal parts. The basic shape of such rectifier supporting devices is known, for example, from the DE-AS 1 256 303 or DE-OS 27 35 124.

In the known manner of construction and supporting of the heat sinks on the one side of the plastic circuit board, difficulties arise in that only a limited space is available for mounting, which space cannot be optionally expanded in the radial direction in order to increase the surfaces of the heat sinks which dissipate heat, since the external dimensioning of the three-phase generator is predetermined by the stator package and the end shields on both sides.

In addition, the manner of construction which is not always absolutely stable and is therefore not very resistant to vibrations involves particular problems, wherein the plurality of rectifier diodes, e.g. four negative diodes and four positive diodes if the star point is likewise connected, are to be supported and connected on the small available space in addition to the usual three exciting diodes. Reliable contact between the connections of the circuit board and the diodes and between the stator wires and the printed circuit board also involves problems.

In view of the labor required in the production of conventional three-phase generators for motor vehicles, which can be drastically reduced or entirely eliminated by means of the present invention, it was particularly troublesome that e.g. four different conductors had to be inserted and correctly positioned by hand in the injection molding die for the production of the circuit carrier or circuit board, respectively, before the injection molding process could begin. In addition, a separate exciting diode rail with welded diodes and the spring used for the D+ —connection had to be riveted in after the injection molding. The W—connection had to be mounted in an individual work step, wherein the stator wires, which end at a desired location after the winding of the stator windings in the stator grooves, had to be bent into different directions so that their end areas could be guided to the locations where the connection to the printed circuit board was effected. Finally, it was necessary to connect the stator wires separately with one another, also in the star point, and to thread individual insulating tubing on the outwardly guided stator wires.

The object of the present invention is to reliably avoid the previous disadvantages and to drastically simplify both the construction and the mounting processes in the production of such a rectifier by means of a special compact construction and, by means of this, in particular, also to make it more resistant to vibrations and more stable.

ADVANTAGES OF THE INVENTION

The invention solves the aforementioned task with the provision of carrier plates (positive and negative heat sinks) receiving and supporting the positive and negative diodes and with an assigned circuit board in which the conductors for the circuit connections of the diodes with one another and with the stator wires are embedded in insulating material; each of the carrier plates for the rectifier diodes extends along a surface comprising more than a half-circle approximating the circular shape of the generator, the carrier plates being constructed, respectively, as a positive heat sink and a negative heat sink, the two heat sinks being arranged coaxially in separate planes at an axial distance from one another, and the circuit board being received therebetween. The invention has the advantage that a construction, which is resistant to vibrations, stable and particularly also compact, is achieved for the rectifier arrangement in its entirety by means of a special construction of the circuit board with carrier plates for the rectifier diodes, which carrier plates are arranged in a sandwich-type arrangement axially on both sides of the circuit board; the rectifier arrangement can be mounted in its entirety externally at the assigned end shield of the three-phase generator and is covered by means of an individual cap-shaped protective hood.

It is particularly advantageous that a good cooling action is achieved by means of the sandwich-type construction in which the carrier plates or heat sinks for the diodes on the two sides of the printed circuit board occupy practically the entire available radial space; the packing density is substantially smaller and the head wires or connection wires of the diodes are then guided from both sides toward the circuit board located inside and connected there with the corresponding connections which project out of the plastics material of the circuit board so as to be exposed.

Nevertheless, the construction of the rectifier supporting device, according to the invention, is noticeably small in the axial direction, in which a first diode carrier plate, the circuit board and the second diode carrier plate are stacked in consecutive manner, also practically no thicker than in the previous type of construction, since the head wires of the diodes arranged in the oppositely located diode carrier plate find sufficient space through the oppositely located openings in the respective diode carrier plates or heat sinks and, although they belong to the other respective diode carrier plate, can be connected with the connections of the circuit board, usually by means of soldering or resistance welding, by means of suitable additional machining steps, on the side of the one diode carrier plate, since they project out over its carrier surface and are also accessible to this extent.

It is also advantageous that the respective diode heat sink (positive heat sink or negative heat sink) can comprise a radial extension which practically corresponds to the entire circular surface of the three-phase generator up to the cut out portion for the brush holder; thus, considerably higher currents can be worked with because of the decisively improved cooling, so as to achieve not only a simplification in the area of the rectifier supporting device, but also so that the entire sequence of functions of the three-phase generator can be considerably improved.

In addition, it is particularly advantageous that the insertion of the conductors in the plastic material of the circuit board, which forms the intermediate part between the two diode heat sinks, can now be carried out by means of an automatic inserting machine, since individual conductors are no longer formed; rather, a continuous, complete punched grid extending over a surface area which approximates a half-circle in its entirety provide the required interconnections within the plastic circuit board and is received so as to be injection molded around by its material.

Since this uniform complete punched grid would first naturally form a short circuit for all interconnections, the corresponding division of the interconnections is effected by separating the four phases and the exciting current rail by means of a punched separation in the injection molding die.

A number of work steps which would otherwise be required for the production of the individual interconnections is dispensed with by means of the punched grid shape of the conductors which is punched out of an half-circle sheet metal blank, wherein the exciting diodes, power diodes and stator wires can be resistance-welded with the connections provided by the punched grid.

Another advantage of the present invention consists in that all of the wire connections of the stator winding proceeding from the stator can be guided upward and received by the printed circuit board; that is, also the connections which, in the conventional design of three-phase generators, form the star or neutral point of the three phases present here. The interconnection of all of the four phases U, V and W, including the star point, as well as the integration of an integrated exciting diode contact rail, is then effected via the punched grid within the circuit board, wherein the star point is also formed within the circuit board, that is, a separate wiring and connection of stator lines outside the circuit board is no longer required.

The circuit board between the diode heat sinks is constructed in such a way that sheathe-like or tubular extensions proceed from the latter and, during the fastening of the entire rectifier supporting device at the three-phase generator, are guided directly up to the places where respective stator wire ends are available as wire connections after winding. These sheathes of the circuit board then receive these stator wires which are guided vertically, that is, without the need for any bent portions, to the respective welding lugs of the circuit board. In so doing, these sheathes at the circuit board simultaneously serve as insulation between an end shield of the generator housing (the end shield on the slip ring side) and the stator wires, since rectifier supporting device in the present invention is placed and mounted on the end shield from the outside, which end shield receives the stator package on one side directly via a fit.

In this connection, no additional effort is needed to weld the required outward leading connections, e.g. the D+ and W-connections, directly to the punched grid in the form of bolts or to construct them in a corresponding manner.

Finally, another preferred construction of the present invention consists in that the respective connection ends formed by the punched grid in the circuit board are constructed and bent in a U-shaped manner in order to achieve a reliable contact between the printed circuit board connections and the diodes, as well as between the stator wires and the circuit board connections. One or two diode wires and the connections of the stator (U, V, W and the star point connections), respectively, are then inserted in this U-shape and are then secured and welded by means of further bending and pressing the U-shape of the connection contact, that is, by means of crimping.

Further advantageous developments and improvements of the rectifier supporting device, according to the invention, are made possible by means of the steps mentioned in the subclaims.

DRAWING

Embodiment examples of the invention are shown in the drawing and explained in more detail in the following description.

DESCRIPTION OF THE EMBODIMENT EXAMPLES

The basic idea of the present invention is that the positive heat sink, the circuit board and the negative heat sink are arranged in a sandwich-type construction and in axially spaced sequence. As seen from the outside to the inside of a three-phase generator, the above mentioned structural component parts, which are stacked in a sandwich-type construction, are connected with one another and assigned to the three-phase generator as rectifier unit, and are placed on and screwed to a non-illustrated end shield of the generator housing, preferably from the outside.

Figure 1:
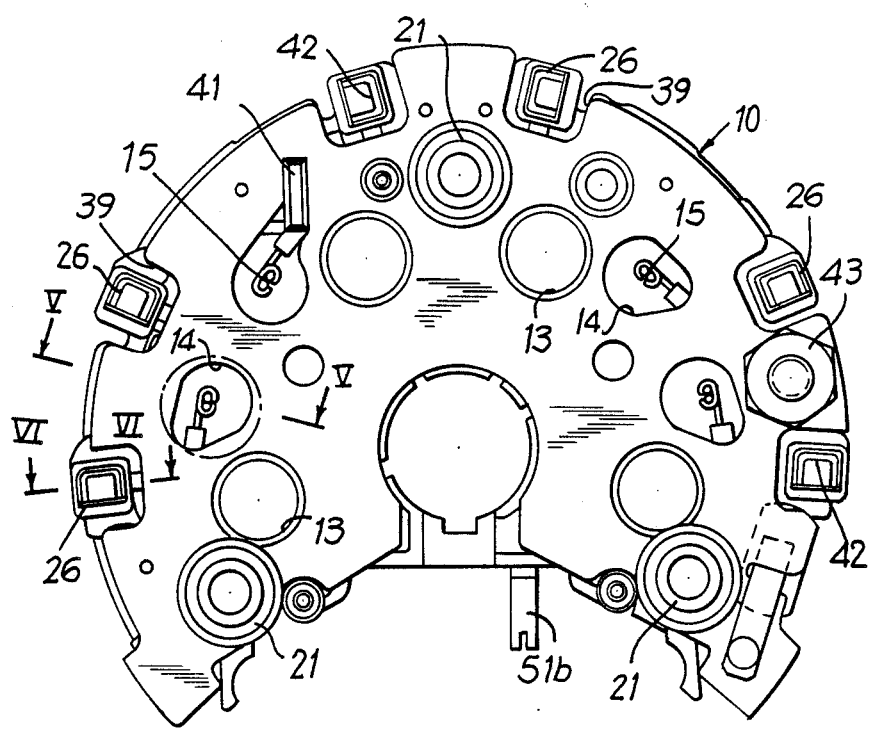
FIG. 1 shows a top view of the carrier plate or heat sink, for the positive diodes (positive heat sink)
Figure 2:
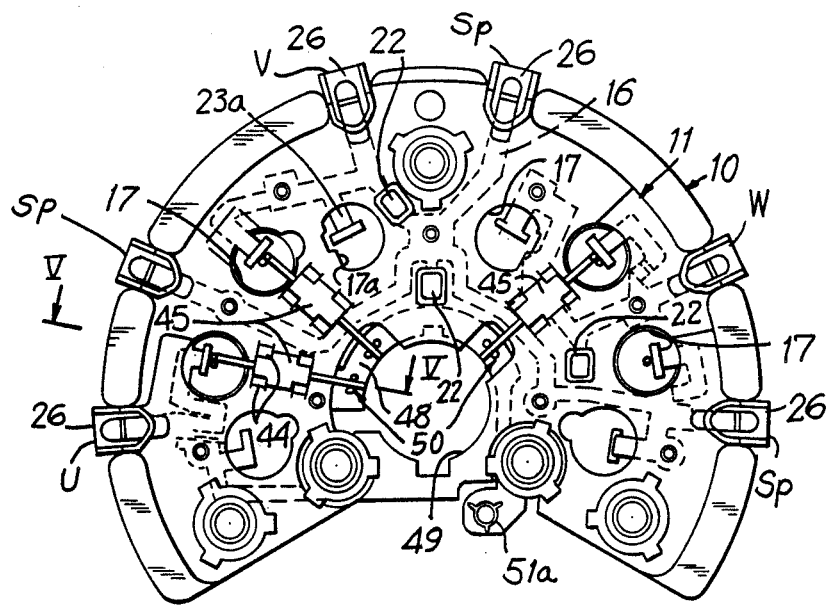
FIG. 2 shows a top view of the circuit board with the positive heat sink omitted.
Figure 3:
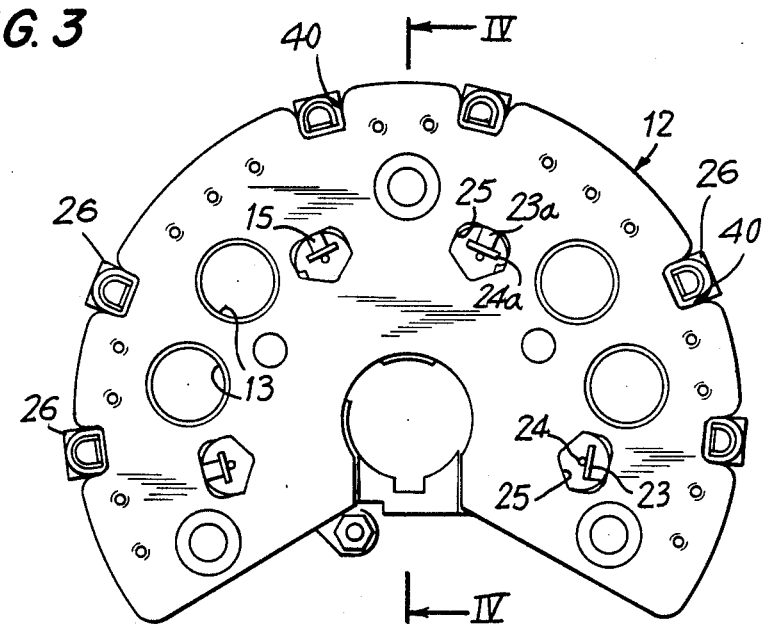
FIG. 3 shows a view from below of the negative heat sink as the latter faces toward an end shield on which it is supported.

In FIG. 1, the positive heat sink 10 has the form of a circular segment and serves as a carrier plate; it is located above the circuit board 11, shown in FIG. 2, which is substantially covered by it, but which can be s . in part through cut out portions in the positive heat sink 10. In the same way, the negative heat sink 12, shown in FIG. 3, is located below the circuit board 11; each of the two heat sinks 10 and 12 comprises main bore holes 13 for receiving the rectifier diodes of conventional shape which are inserted therein, whereby the metal diode housing forms one terminal of the diode and the head wire forms the other terminal. This is known and need not be discussed further.

Since, as was already mentioned, the positive heat sink 10 and the negative heat sink 12 are arranged so as to face toward one another with circuit board 11 located between them, the head wires projecting from the diodes inserted in the respective heat sinks are also directed to the facing side of the printed circuit board 11, as well as to the corresponding oppositely located heat sink. In order to enable a free passage in this instance and, in particular, in order to carry out the required electrical connections and contacts with the conductor lugs or connection ends of the circuit board itself, the positive heat sink 10 and negative heat sink 12 comprise additional openings 14 which serve for the passage of the head wires of the respective oppositely located diodes as well as for the correspondingly assigned terminal lugs of the circuit board and also to prevent a short circuit of the head wires of terminal lugs with respective heat sink of opposite polarity. The positive heat sink and the negative heat sink therefore lie practically one opposite the other with the circuit board located between them and the head wires of diodes located in one heat sink penetrate the oppositely located bore holes in the other heat sink; moreover, the respective connections to be produced, which are designated in their entirety by 15, can also be clearly recognized through these bore holes.

In order to gain a better overview, the construction and form of the printed circuit board 11 arranged between the two heat sinks will first be discussed in more detail in the following with the aid of FIG. 2.

The printed circuit board 11 comprises a plate-shaped base body having a surface area which only slightly exceeds a half-circle shape and defines a segment-like cut out portion which provides the space for the brush holder which is built onto the end shield of an electric generator. The plate-shaped body of the circuit board 11 comprises insulating plastic, and a punched grid, which consists of a suitable electrically conducting metal and is designated by 16, is embedded in the circuit board 11, i.e. the plastic material of the latter is injection molded around it. A possible embodiment form of such a punched grid 16 is shown in a more detailed manner in FIG. 7—this will be discussed in the following.

Since the punched grid 16, which is punched out of a suitable circular sheet metal blank (MS-plate), is still in one piece when inserted into the injection mold for producing the circuit board, the punched grid can be introduced in the mold by an automatic inserting device without requiring manual intervention.

The plastic material of the circuit board then completely encloses the basic shape of the punched grid with the interconnections, wherein openings and passages 17 in optional form, e.g. circular or circle-segment cut out portions, through which ends of the punched grid forming electrical connections emerge, remain open. These end connections are then bent either upward or downward, with reference to the drawing plane of FIG. 2, i.e. following the direction of the positive heat sink 10 or the negative heat sink 12 and the stator wires, respectively.

Figure 4:
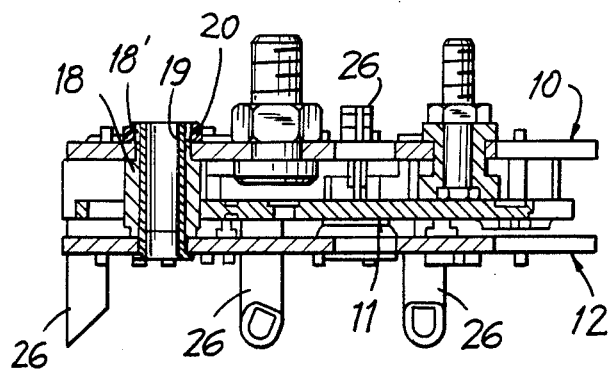
FIG. 4 shows a section along line IV—IV of FIG. 3.

As shown by the cross-sectional shape in FIG. 4, the circuit board comprises sleeve-like thickened portions 18 at certain places which preferably widen toward both sides and serve as spacers between the two heat sinks 10 and 12 and are simultaneously used for producing a secure connection of the sandwich construction consisting of positive heat sink 10, circuit board 11 and negative heat sink 12 by means of hollow rivets 19 arranged at this place. Moreover, it can be seen in FIG. 4 that the rivet connection 19 contacts the negative heat sink 12 without intermediary, whereas a tapering annular spacer 18′ and an insulating washer 20 ensure that the upper rivet head emerging from the positive heat sink 12 is insulated relative to it. A predetermined quantity of these transverse connections can be provided in order to achieve a sufficient stability; as shown in FIG. 1, a total of three transverse connections 21 are formed by means of hollow rivet connections 19.

The punched grid 16, which is located in the circuit board shape and is shown in dashed lines, can be seen in FIG. 2. In order to achieve the required conductor separations, the flat sheet metal bands forming the punched grid and comprising a desired curved configuration are interrupted at predetermined places by means of an additional punching process; these places are designated by 22 in FIG. 2. The cutting up of the conductors in the circuit board is preferably effected by means of punching separation in the injection molding die, since the conductors which are now separated remain securely held and positioned within the plastic material of the circuit board.

The further assembly process can be seen clearly; namely, if the positive heat sink of FIG. 1, which comprises the four positive diodes pressed into the openings 13, is in a first work step connected with or placed on the circuit board of FIG. 2, it can be seen that the head wires of the positive diodes project into the openings 17 in the circuit board at predetermined places so as to practically adjoin the sheet-metal connection lugs of the conductors of grid 16 which are likewise located in these openings and are already bent into the corresponding direction, in this instance toward the negative heat sink 12; these predetermined places are, of course, distributed in optional manner (for this reason, moreover, the structures, spacing of bore holes, basic shapes and wiring arrangements which are shown are not to be seen as limiting the invention). For a clearer understanding, one of these connection contacts or one of these connection lugs is designated by 23 in FIG. 3, and the respective head wire of a positive diode to be connected with this connection contact is designated by 24. These two, electric connections (diode head wire and connection lug) 23,24 can also be seen in FIG. 3 through a corresponding recess or opening 25 in the negative heat sink 12, and also project through this recess of opening by a given distance at another location into sheathes 26 as shown in FIGS. 1–4. Therefore, it is possible to carry out the connection of the two connections through this opening 25 in one heat sink, which opening 25 is aligned with the respective press-in diode in the other heat sink—the respective bore holes—for receiving the diodes in the two heat sinks are offset relative to one another for this reason. The connection can be carried out, e.g. by means of resistance welding or a prior clamping process (crimping), which will be discussed in more detail in the following.

This process is repeated in all assembly steps, wherein only one of the bent contact lugs 23a is designated in FIG. 2; this bent contact lug 23a occurs again in FIG. 3 (in a mirror-inverted manner) together with the head wire 24a of the respective positive diodes which first penetrate the corresponding opening 17a in the circuit board proceeding from the positive heat sink 10 and then penetrate the opening 25a in the oppositely located heat sink, that is, the negative heat sink 12, in this case.

In another construction of the present invention, guide means are provided for the contact wires coming from the stator, which guide means are constructed so as to follow the periphery of the circuit board and so as to form one piece with the circuit board.

In the present invention, in which a star point or neutral terminal is formed within the circuit board by the common connection of conductors (flat sheet metal bands) extending in the latter, there are, in case of a three-phase generator with three phase windings, six electrical contact wires to be received in guide means which proceed from the stator. These guide means of the circuit board can be, and preferably are, arranged at those places along the periphery of the circuit board at which the connection wires of the phase winding actually at the stator occur, according to the type of winding and beginning and end of each of the phase windings, so that it is not necessary to bend such stator wires in various directions. The guide means are preferably constructed in the form of hollow tubes, henceforth designated as sheathes, which proceed downward from the circuit board in the direction of the stator and, in the embodiment example shown here, extend through corresponding passages in the end shield adjacent to the winding packages of the stator.

Figure 6:
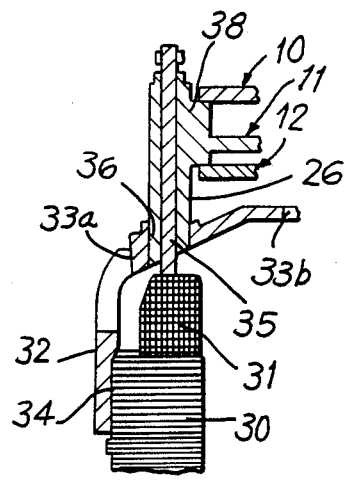
FIG. 6 shows a sectional view along line VI—VI of FIG. 1, with fragments of the an end shield

In the drawings, these guide sheathes for the stator connection wires are designated by 26, wherein the basic mechanism is explained with the aid of the enlarged detailed sectional view in FIG. 6. In FIG. 6, the stator package comprising stacked sheet iron is designated by 30, one of the phase windings is designated by 31. It can be seen that the end shield 32, with ventilation openings 33a and 33b, receives the stator package in a fit 34, wherein the stator connection wire proceeding from the respective phase winding 31 is designated by 35. This wire 35 proceeds upward in a straight line and, practically immediately over the phase winding 31 and prior to passing through a corresponding through-opening 36 in the end shield 32, is received by the sheathe 26 which, as can clearly be seen, is constructed so as to form one piece with the circuit board 11 and is located adjacent to the outer circumference of a thickened portion 38 of the circuit board which serves as a support for the positive heat sink 10 and the negative heat sink 12 at both sides, which latter are only indicated. The thickened portion 38 need not necessarily be constructed so as to extend circumferentially at the circumference of the circuit board, but is preferably restricted to the narrow regions at the circumference of the circuit board at which the sheathes 26 are formed. In this way, there also results a good ventilation and free passage of the cooling air which is sucked into the interior of the three-phase generator.

It is noted with respect to the guidance of cooling air that in the preferred embodiment example of a three-phase generator, to which the embodiment form of the rectifier supporting device, according to the invention, belongs, the rotary driven impellers are arranged so as to directly adjoin the stator package on both sides while still being within the housing formed by the two end shields, so that the cooling air is guided inward toward the stator package through the rectifier supporting device, as described, and is guided out again radially from there, namely through the cooling air openings 33a. It can be seen that a particularly good cooling of the large-area positive and negative heat sinks 10 and 12, as well as of the supporting plate 11 located between the latter, results in this manner.

The connection or contact clips of the respective conductors of the punched grid material are located in each sheathe together with the stator connection wires 35 projecting into the sheathes 26, as can be seen best from FIG. 2. As indicated by dashed lines, corresponding interconnections, preferably in the form of flat sheet-metal bands, in this instance, are guided up to the peripheral areas of the circuit board 11 to which the sheathes 26 are attached and, after exiting from the material of the circuit board in the sheathes, are then bent upward in this instance, that is, in the direction of the positive heat sink 10.

FIG. 1 shows that the positive heat sink 10 comprises, in the area of the sheathes 26 proceeding from the supporting plate, peripheral recesses 39 which allow the sheathes to pass through; the same is true for the negative heat sink 12, where such peripheral openings or recesses are designated by 40. The respective connection clips—and this also applies to the connection clips to be connected with the diode head wires—project from the punched grid conductors and the stator wires over the end of the sheathe guide and accordingly also over the upper surface of the positive heat sink 10, in this case, as can best be seen from FIG. 6, so that an easy accessibility results for the additional connection steps (secure contact between the connection wires or wire ends and the connection clips).

Figure 7:
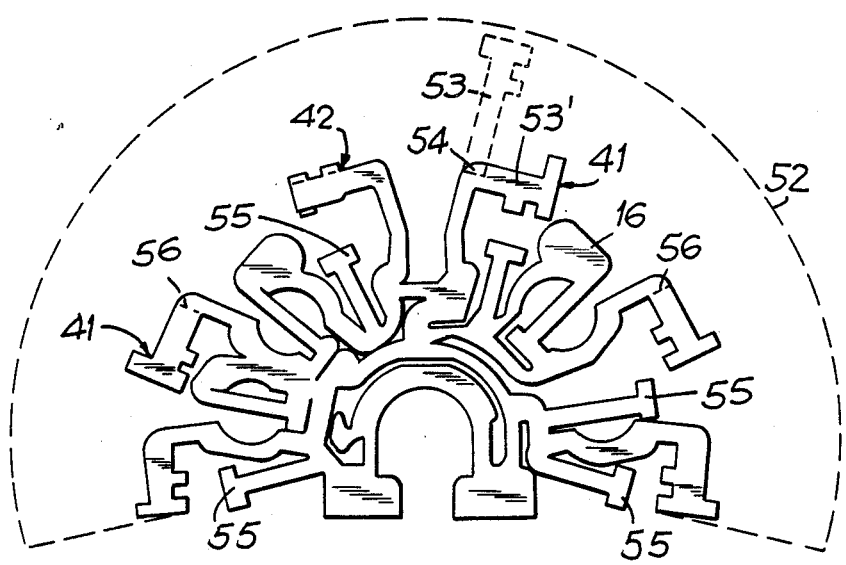
FIG. 7, shows a top view of an embodiment form of a one-piece punched grid to be introduced into the material of the circuit board during the production of latter by means of injection molding prior to the production of the interruption in the grid.

In this instance, a preferred embodiment form of the present invention is used here which consists in constructing the connection ends in a generally hammer-like manner, as shown at 41, so that it is possible to bend these connection ends into a U-shape, as is shown at 42 in FIG. 7, in order to achieve a particularly secure, vibration-proof and stable contact between the circuit board connections and the diodes, as well as between the circuit board connections (punched grid connection clips) and the stator wires already at the punched grid 16, as shown in FIG. 7. Depending on the respective requirements of the electric wiring, one or more diode wires and the stator connection wires U, V and W, respectively, as well as the stator connection wires brought together to form the star or neutral point, are inserted in this U-shape, which can be seen particularly clearly in the connection ends in FIG. 1 designated with the same reference number 42; next, the U-shape is pressed together, i.e. crimped, and welded, preferably by means of resistance welding.

All of this labor, e.g. for the connections of the negative diodes (proceeding from the negative cooling plate 12 and penetrating the corresponding through-openings 14 in the positive heat sink 10), as well as for the six stator connection wires, can be carried out from the outside after the entire rectifier supporting device has been placed on the three-phase generator housing (end shield 32), since these contact connections are freely accessible.

In order to fasten the rectifier supporting device, in its entirety, at the end shield of the three-phase generator, the hollow rivet guides 21, which serve in the first place for fastening the sandwich form consisting of positive and negative heat sinks and the circuit board, can be used as through bore-holes for screw connections, which are then inserted and screwed in corresponding threaded openings of the end shield. It is clear that the − and the + connections for the three-phase generator can easily be reached in this manner by providing corresponding screw connections or plug-in connections at the positive heat sink or negative heat sink. Such connections are designated in their entirety by 43 in FIG. 1; the same applies for one of the connections (W-connection), e.g. for determining the rotary speed and the like.

An arrangement which is particularly troublesome and must usually always be carried out, assembled and supported separately, is the placement of the so-called exciting diodes and their D+ connection rail; this problem is also solved in a particularly simple and advantageous manner by means of the present invention.

Figure 5:
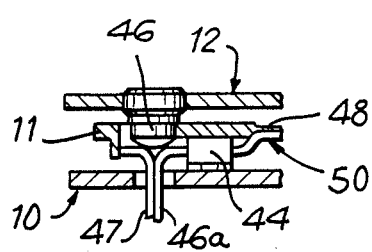
FIG. 5 shows a section along line V—V of FIG. 1 and V—V of FIG. 2 with the diode head wire at the bottom.

Projections 44 resembling retaining claws, which are preferably constructed in one piece at the circuit board 11, as can best be seen from FIG. 2 in combination with FIG. 5, which is drawn in reverse, that is, with the negative heat sink 12 located on the top, serve to support the smaller exciting diodes which are constructed so as to be approximately cylindrical.

The exciting diodes 45 (see FIG. 2) are clipped into the retaining clips, which open in a scissor-like manner, or into projections 44 at the printed circuit board, wherein one connection wire, as shown in FIG. 5, is connected with the head wire 46a of a negative diode 46 and a corresponding connection clip 47 of the punched grid shape and is crimped and welded with the latter. The other connection in the shown preferred embodiment example runs from the outside to the inside toward the D+ rail 48 which extends in an approximately circular manner in this instance and is likewise embedded in the printed circuit board 11 as part of the punched grid, but only along the inner round cut out portion 49 in the printed circuit board 11 to the extent that certain places on the D+ rail 48 remain open, namely where the other connection wires of the exciting diodes 45 are welded or otherwise connected, as shown in FIG. 2 at 50. In this way, the connection D+ results at an outwardly guided part of the D+ rail, which connection D+ is constructed as a screw terminal and designated by 51a in FIG. 2 and is constructed as a plug-in connection and designated by 51b in FIG. 1.

Another preferred construction of the present invention consists in that normally, i.e. with the six phase connections U, V and W, as well as the star point connections which are present in this instance, in order to produce the punched grid form corresponding to FIG. 7, six connection ends of the punched grid must be produced and bent along the peripheral circumference of the printed circuit board 11, so that an initial sheet metal shape with the contour 52 shown in dashed lines in FIG. 7 usually proves necessary. In such a sheet metal shape, which is comparatively large in circumference, the outermost connection ends, one of which is shown in dashed lines by 53 in FIG. 7, can then be bent upward (or downward, respectively) approximately along the bent portion 54, so that the required three-dimensional punched grid shape results—the various connection ends for producing the connections with the diode head wires are designated by 55 in FIG. 7.

Since it is recognized in the invention that it is unimportant whether the U-shape of the connection clips for contact in the circumferential direction are open or face radially inward or outward, as is the case in FIG. 1, the outer connection ends with the hammer-like extensions are arranged in the punched grid 16 so as to be bent for forming the U-shape, that is, generally in the peripheral direction, so that a substantially smaller contour and therefore also a smaller quantity of material results, as can easily be seen at 53, In this case, it is only important that the bent portions of the connection ends are effected along lines 56. In this way, it is possible to arrange the connection ends of the punched grid shape with the U-shaped contacts vertically relative to the drawing plane in the three-dimensional form.

In order to deal with a practical wiring example at least in an approximate manner, the individual wires proceeding from the stator are designated with respect to their electric assignment, that is, the phase connections U, V, W and the connection wires Sp guided to the star point.

All of the features shown in the description, the following claims and the drawing can be substantial to the invention individually as well as in desired combination with one another.

We claim:

1. Rectifier supporting device for attachment to a circular end shield of a housing of a generator designed for use in motor vehicles, comprising two facing carrier plates of a heat conducting material for supporting rectifying diodes having head wires; a circuit board of electrically insulating material in which conductors for circuit connections of the diodes and of stator wires of the generator are embedded; the circuit board being arranged between the carrier plates; each of the carrier plates and the circuit board having a shape of a circle segment approximating more than a half of the circular shape of the end shield to define a segment-like cutout for accommodating a brush holder of the generator; one of the carrier plates being constructed as a positive heat sink and the other carrier plate as a negative heat sink; and the two heat sinks and the circuit board being arranged coaxially in separate planes at an axial distance one from each other.

2. Rectifier supporting device according to claim 1, characterized in that, for the purpose of spacing the two positive and negative heat sinks (10, 12) arranged on opposite surfaces of the circuit board, the latter comprises thickened portions which form spacing sleeves (18) at determined locations, thickened portions being constructed in such a way that every spacing sleeve comprises an insulating sleeve prolongation (18') for insulating the two heat sinks relative to one another, and in that connecting means (hollow rivets 19) is insulated relative to one of the heat sinks by means of an insulating washer (20), are guided through the respective spacing sleeves.

3. Rectifier supporting device according to claim 1 wherein the generator is a three-phase generator.

4. Rectifier supporting device according to claim 3, characterized in that the rectifier diodes received by the respective heat sinks are aligned with their respective head wires (46a) through corresponding openings (17) in the circuit board (11) on the respective oppositely located heat sink.

5. Rectifier supporting device according to claim 4, characterized in that the heat sinks (10, 12) comprise first bore holes (13) for receiving the rectifier (in a press fit or soldered connection) and openings (14; 25, 25a) for a contactless passage of the head wires from the respective oppositely located heat sink and connection ends (flat sheet-metal connection clips 53') of a conductor configuration (punched grid 16) in the circuit board (11).

6. Rectifier supporting device according to claim 5, characterized in that in order to facilitate the production of the connections between the rectifier diode head wires and the respective contact or connection clips of the circuit board conductors, they are guided through the oppositely located openings in the heat sink having the different polarity and project over its upper surface.

7. Rectifier supporting device according to claim 5, characterized in that the conductors within the circuit board are formed by a punched grid in the form of a flat sheet-metal cut-out which is first completely continuous and is embedded into the mold of an injection molding die with separation of conductors assigned to the respective (four) phases and an exciting current rail by means of subsequent punching separation in the injection molding die after being embedded in the material of the circuit board (11).

8. Rectifier supporting device according to claim 7, characterized in that connection ends proceeding form the punched grid in the circuit board (11) are bent downward and upward out of the plane of the circuit board in the direction of one of the heat sinks (positive heat sink 10, negative heat sink 12), which are arranged on both sides and carry the rectifier diodes and are arranged at locations at which the diode rectifier head wires and stator connection wires guided up from the stator, respectively, are located.

9. Rectifier supporting device according to claim 8, characterized in that the connections ends to be connected with the diode rectifier head wires and/or the stator connection wires in the punched grid (16) are constructed in a hammer-like manner for subsequently bending into a general U-shape in which the rectifier diode head wires and stator connection wires are inserted, crimped and subsequently welded or soldered.

10. Rectifier supporting device according to claim 7, characterized in that all stator connection wires (35) proceeding from stator phase windings (31) are preferably guided upward at the location where they exit form the stator windings and are connected with the corresponding connection ends of the original punched grid shape in the circuit board (11).

11. Rectifier supporting device according to claim 10, characterized in that six stator connection wires, in a three-phase generator, are guided upward to produce contact connections with the conductors of the circuit board (11), namely, three phase connection wires (U, V, W) and three wires forming a star point, wherein the star point is formed by means of the conductors of the punched grid within the circuit board (11).

12. Rectifier supporting device according to claim 10 to 12, characterized in that catching means (44) supporting exciting diodes (45) (so as to form one piece) are arranged in the circuit board (11), the exciting diodes being clipped into the catching means (44), and in that connection wires of the exciting diodes are guided to form a common D+ rail formed by the punched grid shape inserted in the circuit board (11) and are connected with the latter.

13. Rectifier supporting device according to claim 12, characterized in that the D+ rail extends in a circular manner along an inner bore hole (49) of the circuit board (11) with parts which are free of the material of the circuit board where the connection with exciting diode connection wires is effected and with an outwardly directed connection D+ (51a, 51b).

14. Rectifier supporting device according to claim 10, characterized in that connection ends of the punched grid to be embedded in the circuit board (11), which connection ends are to be bent upward or downward, are bent in the original punched grid shape so as to follow the circumference of the basic half-circle shape peripherally for the purpose of reducing the required basic contour shape of a punched blank.

15. Rectifier supporting device according to claim 14, characterized in that the connection ends of every punched grid conductor in the basic form are constructed in a hammer-like manner with lateral extensions for subsequent bending into a U-shaped contact clip shape for receiving the respective diode and stator wires with subsequent crimping and welding.

16. Rectifier supporting device according to claim 10, characterized in that the circuit board (11) comprises (one-piece) tubular guides (guide sheathes 26) which are distributed along its circumference and guided in openings at least one of the adjacent heat sinks (10, 12) until adjoining a package of phase windings (31) of the stator for the purpose of receiving and guiding in an insulated manner the stator connection wires proceeding form the phase windings while dispensing with insulating tubing and bent portions up to the connections ends (contact slips 42 of the circuit board 11).

17. Rectifier supporting device according to claim 16, characterized in that the guide sheathes (26) for the stator connection wires (35) are guided through or along corresponding recesses from the uppermost heat sink plate (positive heat sink 10) opposite the stator phase windings package, e.g. so as to terminate flush with its surface, and in that the connection (U-shaped) ends of the conductors of the circuit board (11) and the stator connection wires project out over the surface of the upper heat sink (positive heat sink 10) for implementing the connection process (resistance welding).

18. Rectifier supporting device according to claim 17, characterized in that the sandwich form comprising the positive heat sink (10), circuit board (11) and negative heat sink (12) is placed on and fastened to the facing side of an end shield of the three-phase generator form the outside, wherein sheathes (36) of the circuit board (11) receiving and guiding the stator connection wires are guided through through-openings (36) in the end shield until adjacent to the respective phase winding from which the stator wire exits without bent portions.

19. Rectifier supporting device according to claim 18, characterized in that the sandwich form comprising heat sinks and circuit board which is fastened externally at the end shield (32) of the generator housing is cooled by the air current sucked in by impellers arranged in the interior of the three-phase generator at both sides of the stator.

* * * * *